US011024247B2

(12) United States Patent
Lin et al.

(10) Patent No.: US 11,024,247 B2
(45) Date of Patent: Jun. 1, 2021

(54) ELECTRONIC DEVICE AND DRIVING METHOD THEREOF

(71) Applicant: AU Optronics Corporation, Hsin-Chu (TW)

(72) Inventors: Ya-Ting Lin, Hsin-Chu (TW); Chung-Hung Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 128 days.

(21) Appl. No.: 16/543,952

(22) Filed: Aug. 19, 2019

(65) Prior Publication Data

US 2020/0258467 A1  Aug. 13, 2020

(30) Foreign Application Priority Data

Feb. 11, 2019  (TW) .................................. 108104483

(51) Int. Cl.

| | |
|---|---|
| G09G 3/36 | (2006.01) |
| G06K 19/07 | (2006.01) |
| G11C 19/28 | (2006.01) |
| H01Q 1/22 | (2006.01) |
| H04B 5/00 | (2006.01) |
| G06K 7/10 | (2006.01) |
| G09G 3/20 | (2006.01) |

(52) U.S. Cl.
CPC ....... *G09G 3/3688* (2013.01); *G06K 7/10297* (2013.01); *G06K 19/0723* (2013.01); *G09G 3/20* (2013.01); *G11C 19/287* (2013.01); *H01Q 1/2208* (2013.01); *H04B 5/0062* (2013.01); *G09G 2300/0408* (2013.01); *G09G 2310/0289* (2013.01)

(58) Field of Classification Search
None
See application file for complete search history.

(56) References Cited

U.S. PATENT DOCUMENTS

| | | | | |
|---|---|---|---|---|
| 9,600,053 B2 | 3/2017 | Hicks et al. | | |
| 2004/0150653 A1* | 8/2004 | Sakamaki | ............ | G09G 3/3611 345/592 |
| 2004/0263741 A1* | 12/2004 | Koyama | ............... | G09G 3/3233 349/139 |
| 2005/0088365 A1* | 4/2005 | Yamazaki | ............ | G02B 27/017 345/8 |
| 2005/0264474 A1* | 12/2005 | Rast | .......................... | G09G 3/14 345/55 |

(Continued)

*Primary Examiner* — Parul H Gupta
(74) *Attorney, Agent, or Firm* — WPAT, PC

(57) ABSTRACT

An electronic device, including an antenna, includes a pixel array, a control circuit, and a gate driver. The control circuit is coupled with the antenna, and configured to receive a RF signal from the antenna. The gate driver is coupled with the control circuit and the pixel array, and includes multiple shift registers. Each of the multiple shift registers is configured to output a scan signal to the pixel array. The control circuit is configured to output a triggering signal to a first-stage shift register of the multiple shift registers. When the control circuit receives the RF signal, the triggering signal has a triggering pulse. When the first-stage shift register receives the triggering pulse, the first-stage shift register outputs the scan signal having an enabling voltage level.

15 Claims, 8 Drawing Sheets

(56) References Cited

U.S. PATENT DOCUMENTS

| | | | |
|---|---|---|---|
| 2006/0001624 A1* | 1/2006 | Lee | G09G 3/3233 345/82 |
| 2006/0007098 A1* | 1/2006 | Tong | G09G 3/3413 345/102 |
| 2006/0050044 A1* | 3/2006 | Ikeda | G09G 3/3611 345/98 |
| 2006/0082536 A1* | 4/2006 | Koyama | G09G 3/3659 345/100 |
| 2007/0216668 A1* | 9/2007 | Miyamoto | G06F 3/147 345/204 |
| 2014/0152576 A1 | 6/2014 | Kim et al. | |

* cited by examiner

ELECTRONIC DEVICE AND DRIVING METHOD THEREOF

CROSS-REFERENCE TO RELATED APPLICATION

This application claims priority to Taiwan Application Serial Number 108104483, filed Feb. 11, 2019, which is herein incorporated by reference in its entirety.

BACKGROUND

Field of Invention

The present disclosure relates to an electronic device. More particularly, the present disclosure relates to an electronic device capable of controlling a gate driver according to radio frequency signals.

Description of Related Art

With the popularization of radio frequency identification (RFID) technology, users interact with various electronic devices with RFID technology in the daily lives. For example, the users may use the near-field communication (NFC) function of smartphones to interchange multimedia files with others, or may use chip credit cards to conduct transactions through point-of-sale terminals. In the foregoing scenarios, the users need to exam, through the displays, information related to the operations currently performed. However, when the conventional electronic products receive the RF signals, the conventional electronic products cannot immediately interrupt displaying the image currently displayed, and thus cannot provide the information required by the user in time.

SUMMARY

The disclosure provides an electronic device including an antenna, and the electronic device further includes a pixel array, a control circuit, and a gate driver. The control circuit is coupled with the antenna, and configured to receive a radio frequency (RF) signal from the antenna. The gate driver is coupled with the control circuit and the pixel array, and includes multiple shift registers. Each of the multiple shift registers is configured to output a scan signal to the pixel array. The control circuit is further configured to output a triggering signal to a first-stage shift register of the multiple shift registers. When the control circuit receives the RF signal, the triggering signal has a triggering pulse. When the first-stage shift register receives the triggering pulse, the first-stage shift register outputs the scan signal having an enabling voltage level.

The disclosure provides a driving method suitable for an electronic device including an antenna and a pixel array. The driving method includes the following operations: when a control circuit of the electronic device does not receive a RF signal generated by the antenna, utilizing the control circuit to transmit a start signal having a start pulse to a gate driver of the electronic device; when the gate driver receives the start pulse, utilizing the gate driver to sequentially drive multiple rows of pixel circuits of the pixel array; when the control circuit receives the RF signal, utilizing the control circuit to transmit a triggering signal having a triggering pulse and the start signal having the start pulse to the gate driver; when the gate driver receives the triggering pulse and the start pulse, utilizing the gate driver to sequentially drive the multiple rows of pixel circuits from a first row of pixel circuits of the pixel array.

It is to be understood that both the foregoing general description and the following detailed description are by examples, and are intended to provide further explanation of the disclosure as claimed.

DETAILED DESCRIPTION

Figure 1:
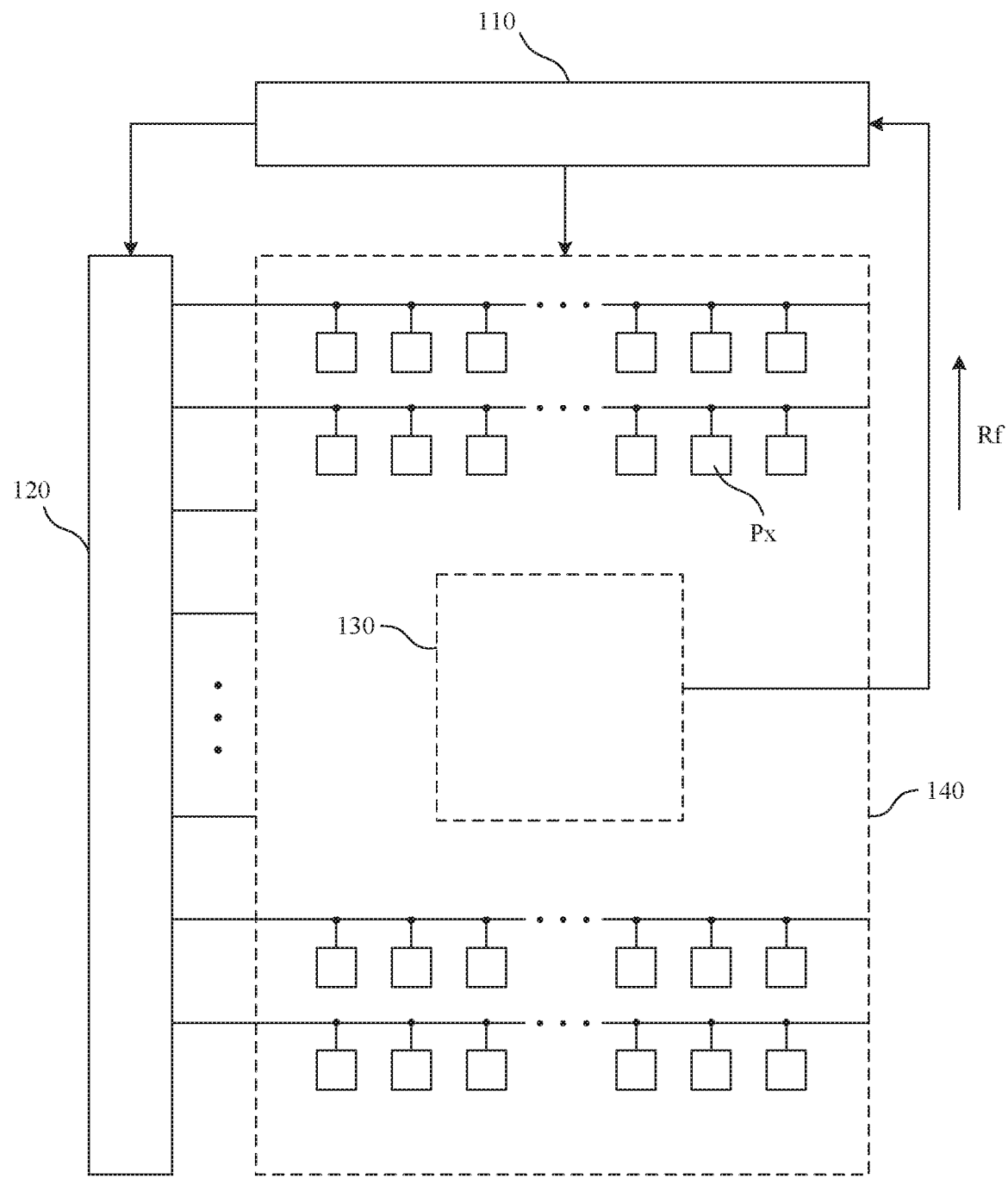
FIG. 1 is a simplified functional block diagram of an electronic device according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of an electronic device 100 according to one embodiment of the present disclosure. The electronic device 100 comprises a control circuit 110, a gate driver 120, an antenna 130, and a pixel array 140, where the pixel array 140 comprises a plurality of rows of pixel circuits Px. The control circuit 110 is coupled with the antenna 130, and configured to receive a radio frequency signal (RF) Rf from the antenna 130. The gate driver 120 is coupled with the control circuit 110 and the pixel array 140. When the antenna 130 performs a wireless communication and generates the RF signal Rf, the control circuit 110 may interrupt the operation of the gate driver 120 regardless of which row of the pixel circuits Px of the pixel array 140 the gate driver 120 is driving. Then, the control circuit 110 may control the gate driver 120 to drive the pixel array 140 from a first row of pixel circuits Px of the pixel array 140. As a result, the electronic device 100 is capable of providing, in time, information carried by the RF signal Rf to a user through the pixel array 140, and needs not to wait for an image not related to the RF signal Rf to be completely displayed. For the sake of brevity, other functional blocks of the electronic device 100 are not shown in FIG. 1.

In practice, the electronic device 100 may be realized by various electronic devices with display function and wireless communication function, such as smart phones, tablet computers, point-of sale terminals, digital billboards, etc. In addition, the antenna 130 may be realized by various antennas complied with the RFID standard, such as NFC antennas.

Figure 2:
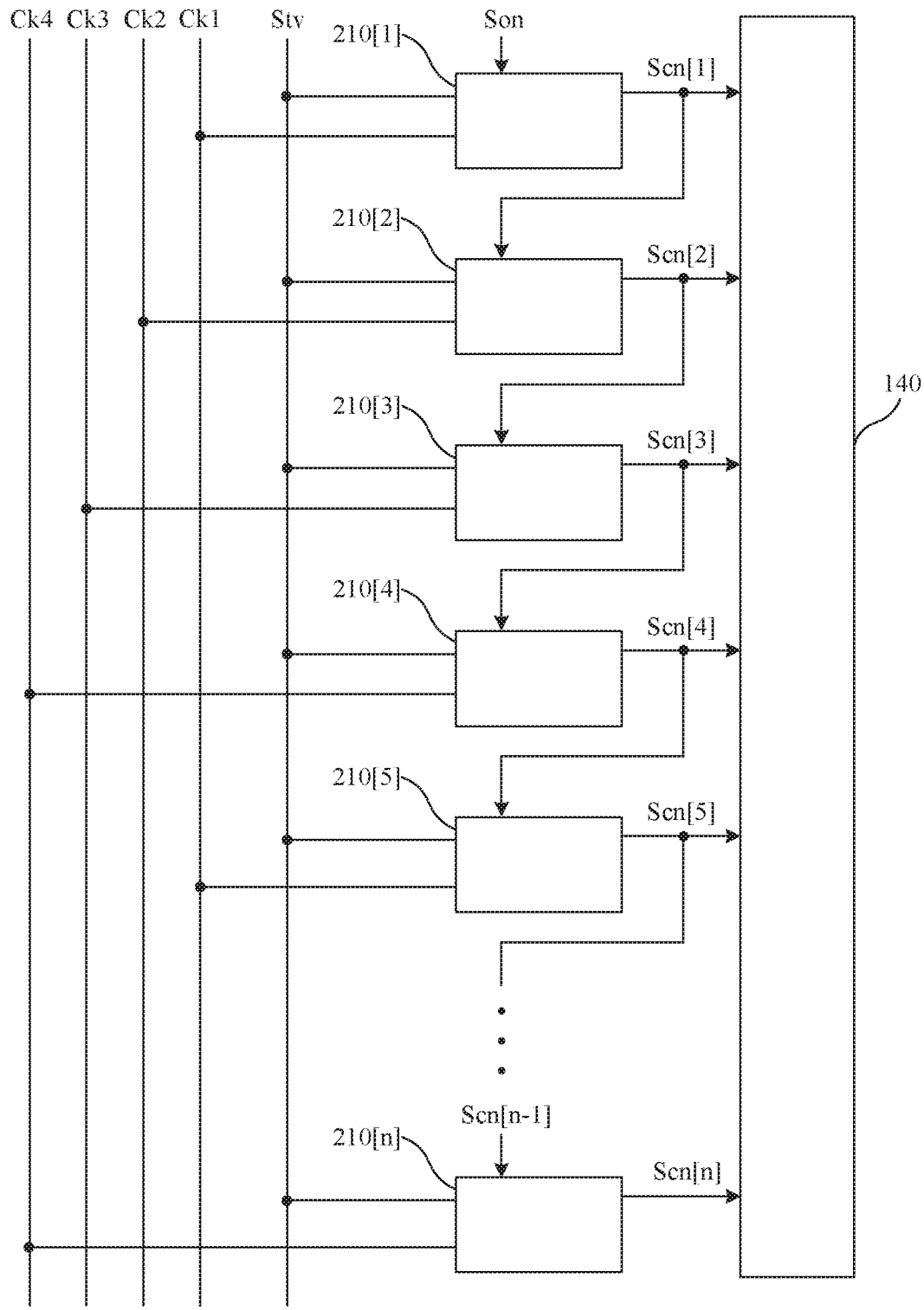
FIG. 2 is a simplified functional block diagram of a gate driver according to one embodiment of the present disclosure.

FIG. 2 is a simplified functional block diagram of a gate driver 120 according to one embodiment of the present disclosure. The gate driver 120 comprises a plurality of shift registers 210[1]-210[n], where n is a positive integer. The shift registers 210[1]-210[n] are configured to sequentially output a plurality of scan signals Scn[1]-Scn[n] to the pixel array 140 according to a plurality of clock signals Ck1-Ck4, so as to correspondingly and sequentially drive the plurality of rows of pixel circuits Px of the pixel array 140.

In this embodiment, the shift registers 210[1]-210[n] are configured to receive a start signal Stv from the control circuit 110. The start signal Stv is configured to trigger the shift registers 210[1]-210[n] to sequentially output the scan signals Scn[1]-Scn[n] having an enabling voltage level, and configured to reset other shift registers 210[2]-210[n] different from the shift register 210[1]. For example, when the gate driver 120 receives the start signal Stv having the enabling voltage level, the shift registers 210[1]-210[n] may output the scan signals Scn[1]-Scn[n] having the disabling voltage level.

The shift register 210[1] is further configured to receive a triggering signal Son from the control circuit 110. The triggering signal Son is configured to notify the gate driver 120 to drive the pixel array 140 from the first row of pixel circuits Px, which will be further explained in the following descriptions.

The number of clock signals Ck1-Ck4 of FIG. 2 is merely an exemplary embodiment. In practice, the number of clock signals required for the operation of the gate driver 120 may be designed according to practical requirements to meet different application scenarios. Throughout the specification and drawings, indexes [1]-[n] may be used in the reference labels of components and signals for ease of referring to respective components and signals. The use of indexes [1]-[n] does not intend to restrict the amount of components and signals to any specific number. In the specification and drawings, if a reference label of a particular component or signal is used without having the index, it means that the reference label is used to refer to any unspecific component or signal of corresponding component group or signal group. For example, the reference label 210[1] is used to refer to the specific shift register 210[1], and the reference label 210 is used to refer to any unspecific shift register of the shift registers 210[1]-210[n]. In another example, the reference label Scn[1] is used to refer to the specific scan signal Scn[1], and the reference label Scn is used to refer to any unspecific scan signal of the scan signals Scn[1]-Scn[n].

Figure 3:
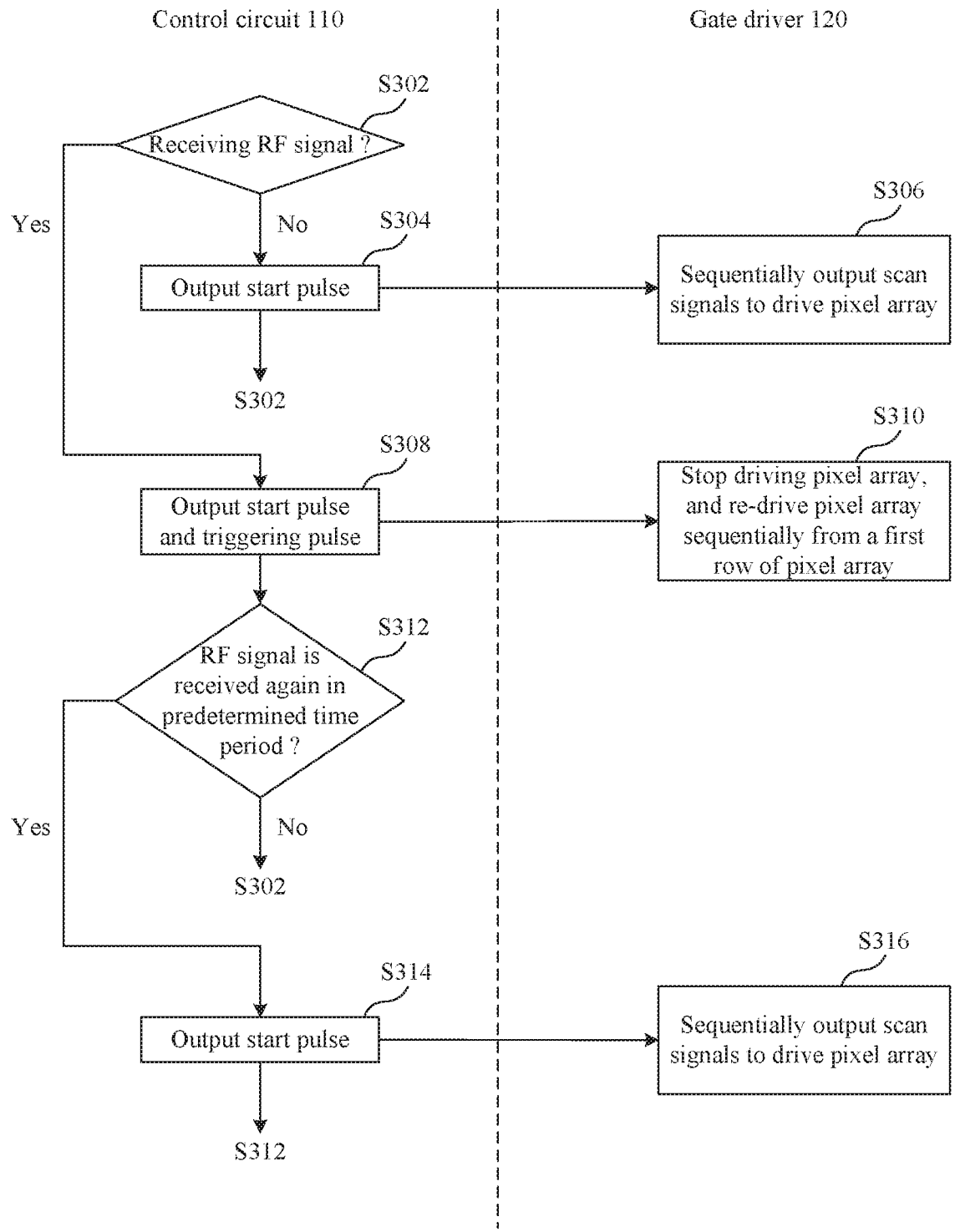
FIG. 3 is a simplified flowchart of a driving method according to one embodiment of the present disclosure.

FIG. 3 is a simplified flowchart of a driving method 300 according to one embodiment of the present disclosure. The driving method 300 is suitable for the aforementioned electronic device 100. In the flowcharts of the present disclosure, operations within a column under the name of a specific device are operations to be performed by the specific device. For example, operations within a column under the label "control circuit 110" are operations to be performed by the control circuit 110, operations within a column under the label "gate driver 120" are operations to be performed by the gate driver 120, and so forth. The same analogous arrangement also applies to the subsequent flowcharts.

Figure 4:
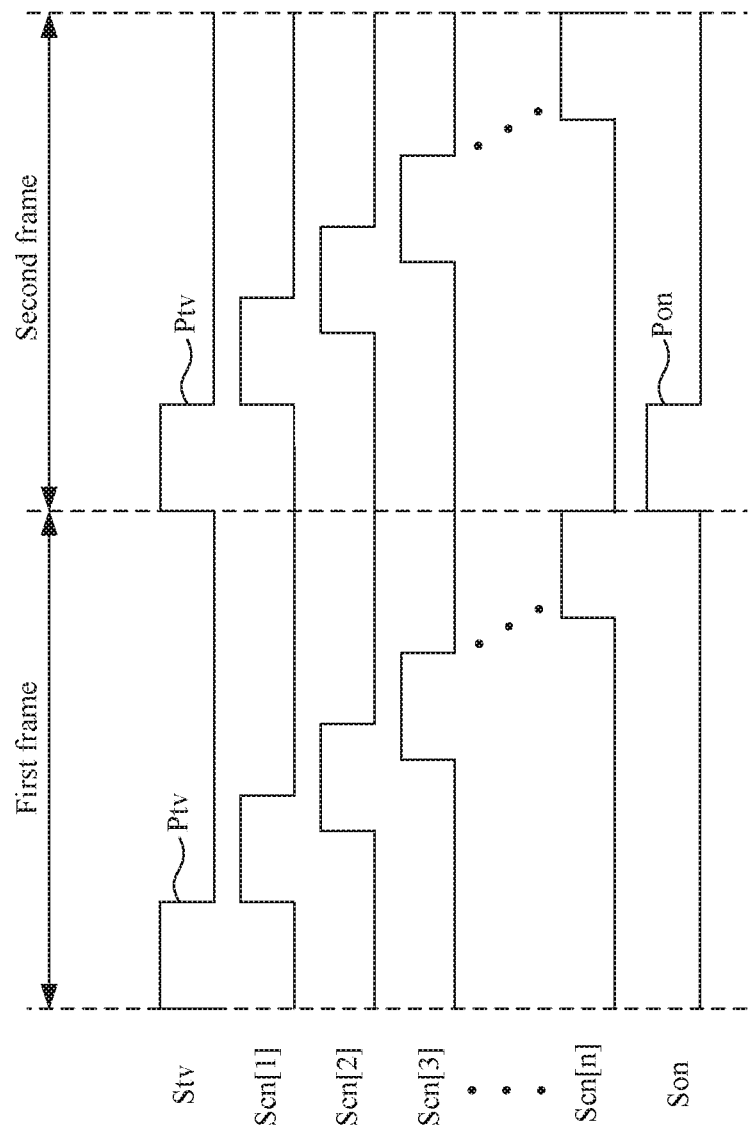
FIG. 4 shows schematic waveforms of output signals of the electronic device according to one embodiment of the present disclosure.

In operation S302, the control circuit 110 may determine whether the RF signal Rf is received from the antenna 130. In the situation that the control circuit 110 does not receive the RF signal Rf, the waveforms of the scan signals Scn[1]-Scn[n], the start signal Stv, and the triggering signal Son are shown under the label of "first frame" of FIG. 4.

In the situation that the control circuit 110 does not receive the RF signal Rf, the control circuit 110 may conduct operation S304 to output the start signal Stv having the start pulse Ptv to the gate driver 120. When the gate driver 120 receives the start pulse Ptv, the gate driver 120 may conduct operation S306 to use the shift registers 210[1]-210[n] to sequentially output the scan signals Scn[1]-Scn[n] having the enabling voltage level, so as to sequentially drive the plurality of rows of pixel circuits Px of the pixel array 140. In addition, when operation S304 is finished, the control circuit 110 may conduct operation S302 again.

In this embodiment, if the control circuit 110 does not receive the RF signal Rf, the control circuit 110 may conduct operations S304 and S306 in each frame period. That is, the control circuit 110 may provide a start pulse Ptv to the gate driver 120 in each frame period. For example, if the electronic device 100 has a frame rate of 60 Hz, the electronic device 100 respectively conducts 60 times of operation S304 and operation S306 in one second. As another example, if the electronic device 100 has a frame rate of 120 Hz, the electronic device 100 respectively conducts 120 times of operation S304 and operation S306 in one second, and so forth.

On the other hand, in the situation that the control circuit 110 receives the RF signal Rf, the electronic device 100 is performing the wireless communication, and thus the operation of the gate driver 120 is needed to be interrupted to timely update the image which is displayed by the pixel array, so that the information received by the electronic device 100 via the wireless communication can be provided to the user. In this situation, the waveforms of the scan signals Scn[1]-Scn[n], the start signal Stv, and the triggering signal Son are shown under the label of "second frame" of FIG. 4.

In the situation that the control circuit 110 receives the RF signal Rf, the control circuit 110 conducts operation S308 to provide the aforementioned start pulse Ptv to the gate driver 120, and also provides the triggering signal Son having the triggering pulse Pon to the gate driver 120. Then, in operation, S310, when the gate driver 120 receives the triggering pulse Pon and the start pulse Ptv, the gate driver 120 sequentially drives the plurality of rows of pixel circuits Px of the pixel array 140 from a first row of pixel circuits Px of the pixel array 140. That is, the pixel array 140 may interrupt displaying the current frame, and then may display a new frame.

Then, in operation S312, the control circuit 110 may determine whether the RF signal Rf is received again in a predetermined time period, so as to determine whether the electronic device 100 is still performing the wireless communication. If the control circuit 110 does not receive the RF signal Rf again in the predetermined time period, the control circuit 110 may conduct operation S302 again. When the control circuit 110 conducts operation S302 again, the electronic device 100 may control the pixel array 140 to resume displaying the interrupted frame.

In one embodiment, when the control circuit 110 conducts operation S308, the electronic device 100 may store the image information corresponding to the interrupted frame. When the control circuit 110 conducts operation S302 again, the electronic device 100 may transmit the image information corresponding to the interrupted frame to the pixel array 140, so that the interrupted frame can be resumed.

On the other hand, if the control circuit 110 receives the RF signal Rf again in the predetermined time period, the control circuit 110 may conduct operation S314 to output the start pulse Ptv to the gate driver 120. Then, when the gate driver 120 receives the start pulse Ptv, the gate driver 120 may conduct operation S316 to use the shift registers 210[1]-210[n] to sequentially output the scan signals Scn[1]-Scn[n] having the enabling voltage level, so as to drive the plurality of rows of pixel circuits Px of the pixel array 140. In operation S316, the control circuit 110 may provide image information corresponding to the RF signal Rf to the pixel array 140, so as to continuously display the information carried by the RF signal Rf to the user.

In this embodiment, if the control circuit 110 receives the RF signal Rf again in the predetermined time period, the electronic device 100 may respectively conduct operations S314 and S316 for one time in each of the later frame periods.

In one embodiment, for example, the electronic device 100 is a digital billboard. When the user brings a chip membership card close to the electronic device 100, the electronic device 100 may control the pixel array 140 to stop displaying an advertisement content currently displayed and use the pixel array 140 to present information related to the user, such as the balance in the account, the recommended products, etc. In the situation that the user keep the chip membership card near the electronic device 100, the electronic device 100 may continuously display the information related to the user. On the other hand, when the user takes back the chip membership card, the electronic device 100 may resume displaying the advertisement content, which has been stopped displaying, after the predetermined time period.

Figure 5:
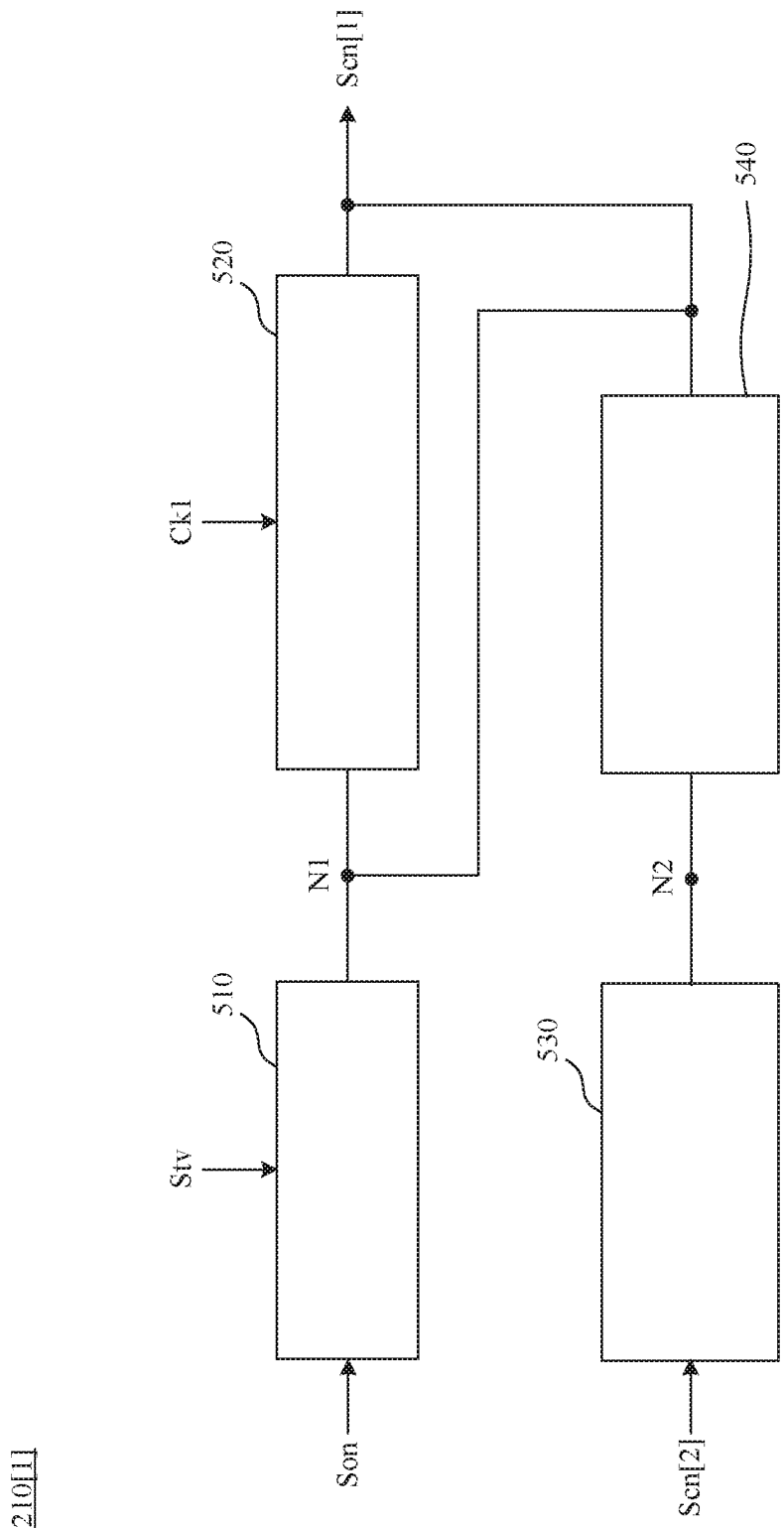
FIG. 5 is a simplified functional block diagram of a first-stage shift register according to one embodiment of the present disclosure.

FIG. 5 is a simplified functional block diagram of a first-stage shift register (i.e., the shift register 210[1]) according to one embodiment of the present disclosure. The shift register 210[1] comprises a pull-up control circuit 510, a pull-up circuit 520, a pull-down control circuit 530, and a pull-down circuit 540. The pull-up control circuit 510, the pull-up circuit 520, and the pull-down circuit 540 are coupled with the first node N1. The pull-down control circuit 530 is coupled with the pull-down circuit 540 through the second node N2. The pull-up control circuit 510 is configured to receive the triggering signal Son and the start signal Stv. When the pull-up control circuit 510 receives at least one of the triggering pulse Pon and the start pulse Ptv. The pull-up control circuit 510 configures a voltage of the first node N1 as a first voltage level (e.g., a high voltage level).

The pull-down control circuit 530 is configured to receive a scan signal Scn[2] outputted by a next-stage shift register (i.e., the shift register 210[2]). When the pull-down control circuit 530 receives the scan signal Scn[2] having the enabling voltage level, the pull-down control circuit 530 configures a voltage of the second node N2 as the first voltage level. When the voltage of the second node N2 has the first voltage level, the pull-down circuit 540 may configure the voltage of the first node N1 as a second voltage level (e.g., a low voltage level).

The pull-up circuit 520 is configured to receive the clock signal Ck1, and is configured to output the scan signal Scn[1] according to the clock signal Ck1 and the voltage of the first node N1. Specifically, when the voltage of the first node N1 has the first voltage level, if the clock signal Ck1 has the enabling voltage level, the pull-up circuit 520 outputs the scan signal Scn[1] having the enabling voltage level. On the other hand, when the voltage of the first node N1 has the second voltage level, even if the clock signal Ck1 has the enabling voltage level, the pull-up circuit 520 would not output the scan signal Scn[1] having the enabling voltage level but output the scan signal Scn[1] having the disabling voltage level.

Figure 6:
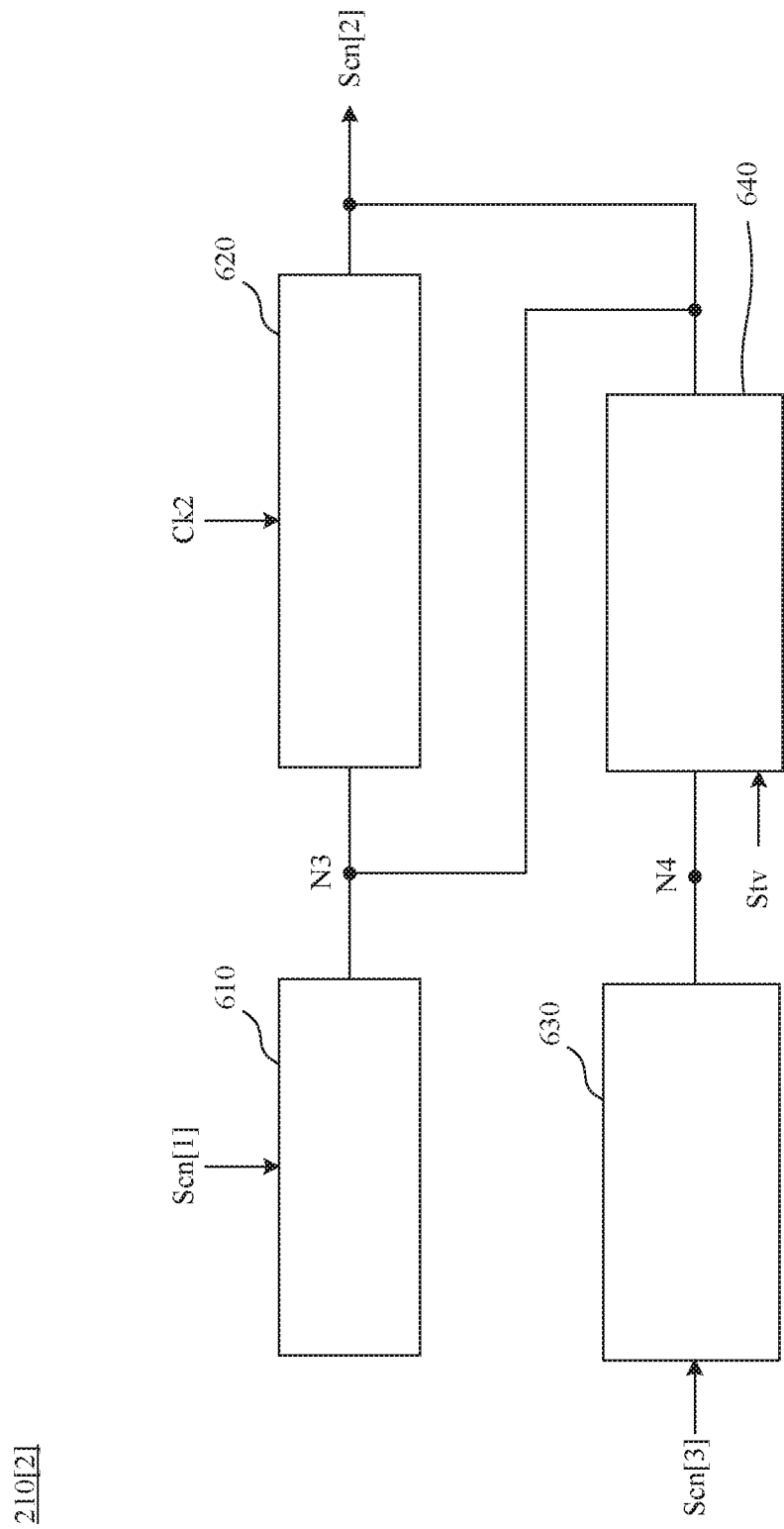
FIG. 6 is a simplified functional block diagram of a second-stage shift register according to one embodiment of the present disclosure.

FIG. 6 is a simplified functional block diagram of a second-stage shift register (i.e., the shift register 210[2]) according to one embodiment of the present disclosure. The shift register 210[2] comprises a pull-up control circuit 610, a pull-up circuit 620, a pull-down control circuit 630, and a pull-down circuit 640. The pull-up control circuit 610, the pull-up circuit 620, and the pull-down circuit 640 are coupled with the third node N3. The pull-down control circuit 630 is coupled with the pull-down circuit 640 through the fourth node N4. The pull-up control circuit 610 is configured to receive a scan signal Scn[1] outputted by a previous-stage shift register (e.g., the shift register 210[1]). When the pull-up control circuit 610 receives the scan signal Scn[1] having the enabling voltage level, the pull-up control circuit 610 configures a voltage of the third node N3 as the first voltage level.

The pull-down control circuit 630 is configured to receive the scan signal Scn[3] outputted by a next-stage shift register (e.g., the shift register 210[3]). When the pull-down control circuit 630 receives the scan signal Scn[3] having the enabling voltage level, the pull-down control circuit 630 configures a voltage of the fourth node N4 as the first voltage level.

When the voltage of fourth node N4 has the first voltage level, the pull-down circuit 640 may configures the voltage of the third node N3 as the second voltage level. In addition, the pull-down circuit 640 is further configured to receive the start signal Stv. When the pull-down circuit 640 receives the start pulse Ptv of the start signal Stv, the pull-down circuit 640 also configures the voltage of the third node N3 as the second voltage level.

The pull-up circuit 620 is configured to receive the clock signal Ck2, and configured to output the scan signal Scn[2] according to the clock signal Ck2 and the voltage of the third node N3. Specifically, when the voltage of the third node N3 has the first voltage level, if the clock signal Ck2 has the enabling voltage level, the pull-up circuit 620 outputs the scan signal Scn[2] having the enabling voltage level. On the other hand, when the voltage of the third node N3 has the second voltage level, even the clock signal Ck2 has the enabling voltage level, the pull-up circuit 620 would not output the scan signal Scn[2] having the enabling voltage level but output the scan signal Scn[2] having the disabling voltage level.

The operations and structures of the shift registers 210[2]-210[n] are similar to each other. That is, the foregoing descriptions regarding the implementations, connections, operations, and related advantages of the shift register 210[2] are also applicable to the shift registers 210[3]-210[n]. For the sake of brevity, those descriptions will not be repeated here.

Figure 7:
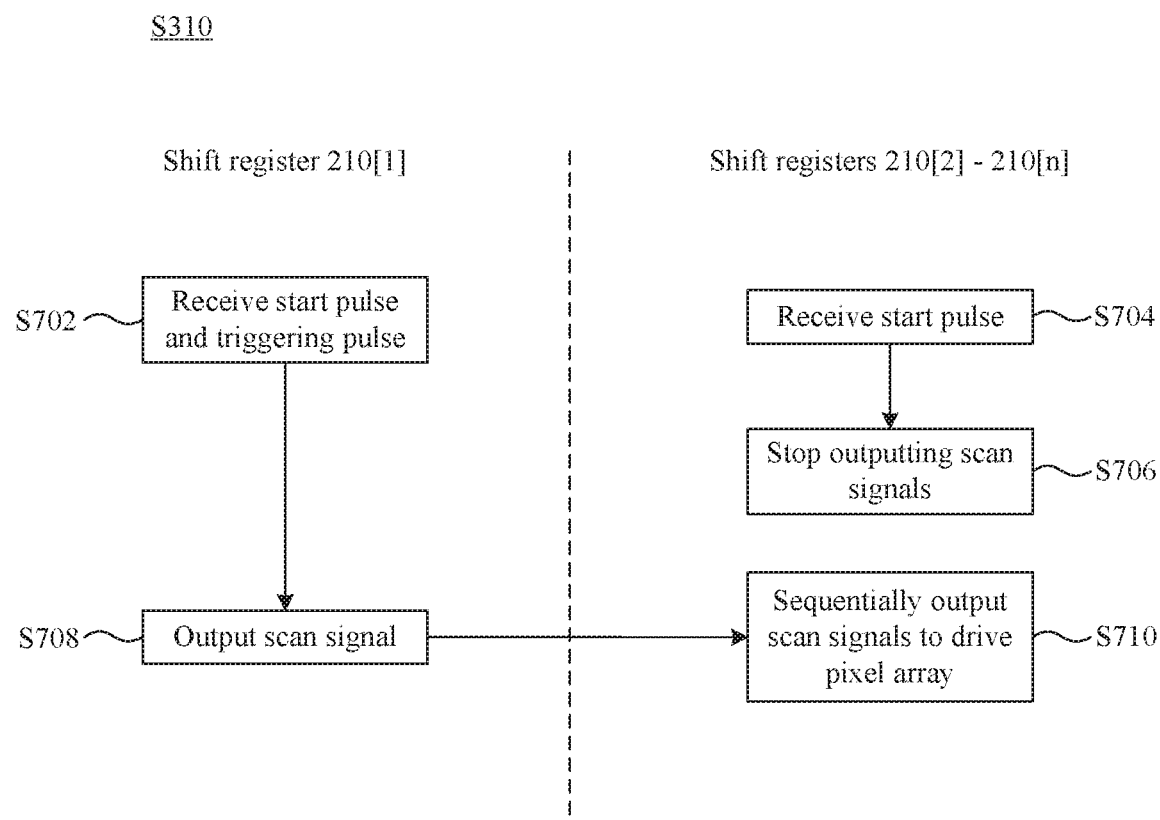
FIG. 7 shows details of operation S310 according to one embodiment of the present disclosure.

The details of operation S310 will be further described in the following by reference to FIGS. 5 through 7. As shown in FIG. 7, when the gate driver 120 receives the triggering pulse Pon and the start pulse Ptv, the shift register 210[1] may conduct operation S702 to receive the triggering pulse Pon and the start pulse Ptv and the shift registers 210[2]-210[n] may conduct operation S704 to receive the start pulse Ptv.

Then, in operation S706, when the pull-down circuit 640 of each of the shift registers 210[2]-210[n] receives the start pulse Ptv, the pull-down circuit 640 of each of the shift registers 210[2]-210[n] configures the voltage of the third node N3 as the second voltage level. In this situation, the pull-up circuit 620 of each of the shift registers 210[2]-210[n] outputs the scan signals Scn[2]-Scn[n] having the disabling voltage level.

In operation S708, when the pull-up control circuit 510 of the shift register 210[1] receives the triggering pulse Pon and the start pulse Ptv, the pull-up control circuit 510 of the shift register 210[1] configures the voltage of the first node N1 as the first voltage level. In this situation, when the clock signal Ck1 is switched to the enabling voltage level, the pull-up circuit 520 of the shift register 210[1] outputs the scan signal Scn[1] having the enabling voltage level.

When the shift register 210[1] outputs the scan signal Scn[1], the shift registers 210[2]-210[n] may conduct operation S710. In operation S710, the pull-up control circuit 610 of the shift register 210[2] receives the scan signal Scn[1] and configures the voltage of the third node N3 of the shift register 210[2] as the first voltage level. Then, the shift registers 210[2]-210[n] sequentially output the scan signals Scn[2]-Scn[] having the enabling voltage level.

Figure 8:
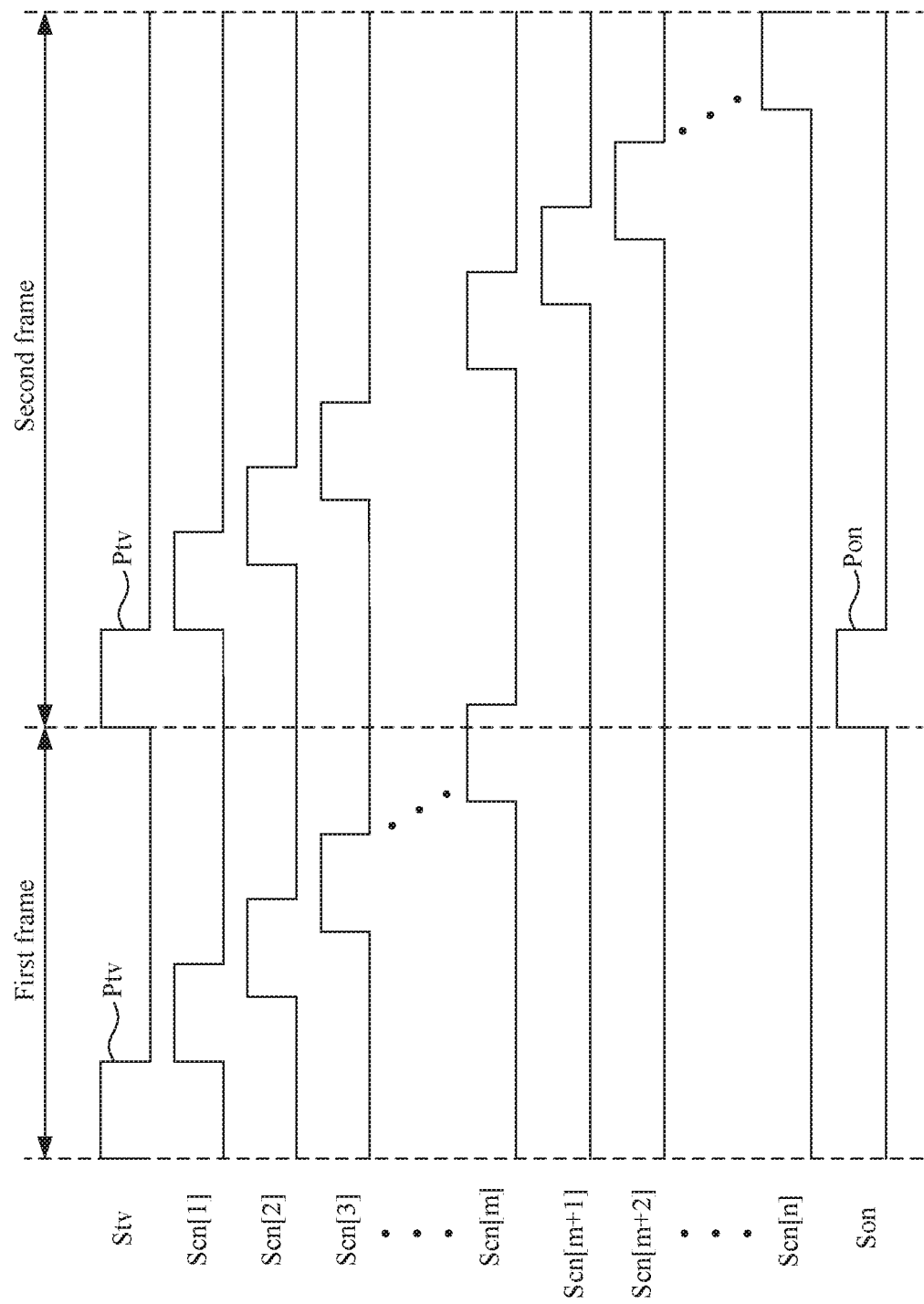
FIG. 8 shows schematic waveforms of output signals of the electronic device according to another embodiment of the present disclosure.

As shown in FIG. 8, for example, when the shift register 210[m] outputs the scan signal Scn[m] so as to drive the pixel circuits Px of an m-th row during the first frame, the control circuit 110 receives the RF signal Rf. In this situation, the control circuit 110 outputs the triggering pulse Pon and the start pulse Ptv to the shift register 210[1], outputs the start pulse Ptv to the shift registers 210[2]-210[n], where m is a positive integer smaller than n.

Therefore, the first node N1 of the shift register 210[1] is configured as the first voltage level, and the third node N3 of each of the shift registers 210[2]-210[n] are configured to the second voltage level. As a result, a plurality of stages of shift registers 210 following the shift register 210[m] outputs the scan signals Scn having the disabling voltage level, so that the pixel array 140 interrupts displaying the first frame.

Then the shift register 210[1] outputs the scan signal Scn[1] having the enabling voltage level to trigger the shift registers 210[2]-210[n] to sequentially re-output the scan signals Scn[2]-Scn[n] having the enabling voltage level. As a result, the pixel array 140 displays the second frame.

As shown in FIG. 8, when the control circuit 110 receives the RF signal Rf, a time point which the triggering pulse Pon is transmitted to the shift register 210[1] is no later than a time point which the start pulse Ptv is transmitted to the shift register 210[1]. Therefore, the shift register 210[1] may perform various pre-operations required for outputting the scan signal Scn[1] earlier. For example, the pre-operations may be using the triggering pulse Pon to pre-charge the first node N1, or using the triggering pulse Pon to reset voltages of other nodes in the shift register 210[1]. As a result, when the clock signal Ck1 is switched to the enabling voltage level, the shift register 210[1] may output the scan signal Scn[1] in time.

In one embodiment, a pulse width of the triggering pulse Pon is wider than a pulse width of the start pulse Ptv, so as to increase the efficiency of the shift register 210[1] to pre-charge the first node N1.

The operations in the foregoing flowcharts are merely exemplary embodiments, and are not intend to restrict the practical implementations of the preset disclosure. For example, operations S302, S304, and S306 of FIG. 3 may be conducted simultaneously, and operations S312, S314, and S316 also may be conducted simultaneously. As another example, operations S702 and S704 of FIG. 7 may be conducted simultaneously, and operations S706 and S708 also may be conducted simultaneously.

As can be appreciated from the foregoing descriptions, when the user interacts with the electronic device 100 through the wireless communication, the electronic device 100 is capable of presenting the information related to the operation currently performed by the user to the user in time. Therefore, the user obtains a timely feedback and the user experience is increased.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electronic device, comprising an antenna, wherein the electronic device further comprises:
    a pixel array;
    a control circuit, coupled with the antenna, and configured to receive a radio frequency (RF) signal from the antenna; and
    a gate driver, coupled with the control circuit and the pixel array, comprising a plurality of shift registers, wherein each of the plurality of shift registers is configured to output a scan signal to the pixel array,
    wherein the control circuit is further configured to output a triggering signal to a first-stage shift register of the plurality of shift registers, and when the control circuit receives the RF signal, the triggering signal has a triggering pulse,
    wherein when the first-stage shift register receives the triggering pulse, the first-stage shift register outputs the scan signal having an enabling voltage level.

2. The electronic device of claim 1, wherein the control circuit is configured to output a start signal to each of the plurality of shift registers, and the start signal has a start pulse in each frame,
    wherein when the plurality of shift registers receive the start pulse, the first-stage shift register outputs the scan signal having the enabling voltage level and each of other shift registers of the plurality of shift registers outputs the scan signal having a disabling voltage level.

3. The electronic device of claim 2, wherein when the control circuit receives the RF signal, the start signal has the start pulse, and the triggering signal has the triggering pulse,
    wherein when the first-stage shift register receives the triggering pulse and the start pulse, the first-stage shift register outputs the scan signal having the enabling voltage level.

4. The electronic device of claim 3, wherein when the control circuit receives the RF signal, a time point which the triggering pulse is transmitted to the first-stage shift register is no later than a time point which the start pulse is transmitted to the first-stage shift register.

5. The electronic device of claim 3, wherein a pulse width of the triggering pulse is wider than a pulse width of the start pulse.

6. The electronic device of claim 2, wherein the first-stage shift register comprises:
a pull-up circuit, coupled with a first node;
a pull-up control circuit, coupled with the first node, wherein when the pull-up control circuit receives at least one of the triggering pulse and the start pulse, the pull-up control circuit configures a voltage of the first node as a first voltage level;
a pull-down circuit, coupled with the first node; and
a pull-down control circuit, coupled with the pull-down circuit through a second node,
wherein when the pull-down control circuit receives the scan signal having the enabling voltage level outputted by a second-stage shift register, the pull-down control circuit configures a voltage of the second node as the first voltage level,
wherein when the voltage of the second node has the first voltage level, the pull-down circuit configures the voltage of the first node as a second voltage level.

7. The electronic device of claim 6, wherein when the voltage of the first node has the first voltage level, the pull-up circuit outputs the scan signal having the enabling voltage level, and when the voltage of the first node has the second voltage level, the pull-up circuit outputs the scan signal having the disabling voltage level.

8. The electronic device of claim 2, wherein each of the other shift registers of the plurality of shift registers comprises:
a pull-up circuit, coupled with a third node;
a pull-up control circuit, wherein when the pull-up control circuit receives the scan signal having the enabling voltage level outputted by a previous-stage shift register, the pull-up control circuit configures a voltage of the third node as a first voltage level;
a pull-down circuit, coupled with the third node, wherein when the pull-down circuit receives the start pulse, the pull-down circuit configures the voltage of the third node as a second voltage level; and
a pull-down control circuit, coupled with the pull-down circuit through a fourth node, wherein when the pull-down control circuit receives the scan signal having the enabling voltage level outputted by a next-stage shift register, the pull-down control circuit configures a voltage of the fourth node as the first voltage level,
wherein when the voltage of the fourth node has the first voltage level, the pull-down circuit configures the voltage of the third node as the second voltage level.

9. A driving method, suitable for an electronic device comprising an antenna and a pixel array, wherein the driving method comprises:
when a control circuit of the electronic device does not receive a RF signal generated by the antenna, utilizing the control circuit to transmit a start signal having a start pulse to a gate driver of the electronic device;
when the gate driver receives the start pulse, utilizing the gate driver to sequentially drive a plurality of rows of pixel circuits of the pixel array;
when the control circuit receives the RF signal, utilizing the control circuit to transmit a triggering signal having a triggering pulse and the start signal having the start pulse to the gate driver; and
when the gate driver receives the triggering pulse and the start pulse, utilizing the gate driver to sequentially drive the plurality of rows of pixel circuits from a first row of pixel circuits of the pixel array.

10. The driving method of claim 9, wherein the operation of when the control circuit of the electronic device does not receive the RF signal generated by the antenna, utilizing the control circuit to transmit the start signal having the start pulse to the gate driver of the electronic device comprises:
utilizing the control circuit to provide the start pulse to the gate driver in each frame.

11. The driving method of claim 10, wherein the gate driver comprises a plurality of shift registers, each of the plurality of shift registers is configured to output a scan signal to the pixel array to correspondingly drive the plurality of rows of pixel circuits,
wherein the operation of when the gate driver receives the triggering pulse and the start pulse, utilizing the gate driver to sequentially drive the plurality of rows of pixel circuits from the first row of pixel circuits of the pixel array comprises:
utilizing a first-stage shift register to receive the triggering pulse and the start pulse;
utilizing other shift registers of the plurality of shift registers, which are different from the first-stage shift register, to receive the start pulse;
when each of the other shift registers of the plurality of shift registers receives the start pulse, utilizing each of the other shift registers of the plurality of shift registers to output the scan signal having a disabling voltage level; and
when the first-stage shift register receives the triggering pulse and the start pulse, utilizing the first-stage shift register to output the scan signal having an enabling voltage level.

12. The driving method of claim 11, wherein when the control circuit receives the RF signal, a time point which the triggering pulse is transmitted to the first-stage shift register is no later than a time point which the start pulse is transmitted to the first-stage shift register.

13. The driving method of claim 11, wherein a pulse width of the triggering pulse is wider than a pulse width of the start pulse.

14. The driving method of claim 11, wherein the first-stage shift register comprises a pull-up control circuit, a pull-up circuit, a pull-down control circuit, and a pull-down circuit, the pull-up control circuit, the pull-up circuit, and the pull-down circuit are coupled with a first node, and the pull-down control circuit is coupled with the pull-down circuit through a second node,
wherein the operation of when the first-stage shift register receives the triggering pulse and the start pulse, utilizing the first-stage shift register to output the scan signal having the enabling voltage level comprises:
when the pull-up control circuit receives the triggering pulse and the start pulse, utilizing the pull-up control circuit to configure a voltage of the first node as a first voltage level;
when the voltage of the first node has the first voltage level, utilizing the pull-up circuit to output the scan signal having the enabling voltage level;
when the pull-down control circuit receives the scan signal having the enabling voltage level outputted by a second-stage shift register, utilizing the pull-down control circuit to configure a voltage of the second node as the first voltage level;

when the voltage of the second node has the first voltage level, utilizing the pull-down circuit to configure the voltage of the first node as a second voltage level; and when the voltage of the first node has the second voltage level, utilizing the pull-up circuit to output the scan signal having the disabling voltage level.

15. The driving method of claim 11, wherein each of the other shift registers of the plurality of shift registers comprises a pull-up control circuit, a pull-up circuit, a pull-down control circuit, and a pull-down circuit, the pull-up control circuit, the pull-up circuit, and the pull-down circuit are coupled with a third node, and the pull-down control circuit is coupled with the pull-down circuit through a fourth node, wherein when the pull-up control circuit receives the scan signal having the enabling voltage level outputted by a previous-stage shift register, the pull-up control circuit configures a voltage of the third node as a first voltage level, wherein the operation of when each of the other shift registers of the plurality of shift registers receives the start pulse, utilizing each of the other shift registers of the plurality of shift registers to output the scan signal having the disabling voltage level comprises:

when the pull-down circuit receives the start pulse, utilizing the pull-down circuit to configure the voltage of the third node as a second voltage level;

when the pull-down control circuit receives the scan signal having the enabling voltage level outputted by a next-stage shift register, utilizing the pull-down control circuit to configure a voltage of the fourth node as the first voltage level;

when the voltage of the fourth node has the first voltage level, utilizing the pull-down circuit to configure the voltage of the third node as the second voltage level;

when the voltage of the third node has the first voltage level, utilizing the pull-up circuit to output the scan signal having the enabling voltage level; and when the voltage of the third node has the second voltage level, utilizing the pull-up circuit to output the scan signal having the disabling voltage level.

* * * * *